United States Patent
Sinha et al.

(10) Patent No.: US 11,018,657 B1
(45) Date of Patent: May 25, 2021

(54) CLOCK GLITCH ALERTING CIRCUIT

(71) Applicant: NXP USA, Inc., Austin, TX (US)

(72) Inventors: Rohit Kumar Sinha, Noida (IN); Stefan Doll, Munich (DE); Neha Srivastava, New Delhi (IN)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 17/247,864

(22) Filed: Dec. 28, 2020

(51) Int. Cl.
*H03K 5/133* (2014.01)
*H03K 5/00* (2006.01)

(52) U.S. Cl.
CPC ... *H03K 5/133* (2013.01); *H03K 2005/00019* (2013.01)

(58) Field of Classification Search
None
See application file for complete search history.

(56) References Cited

U.S. PATENT DOCUMENTS

| | | |
|---|---|---|
| 9,571,289 B2 | 2/2017 | Jaffe |
| 10,690,721 B2 * | 6/2020 | Goh .................. G01R 31/3177 |
| 2008/0086781 A1 | 4/2008 | Rodgers |

FOREIGN PATENT DOCUMENTS

CN 102195619 B 9/2014

* cited by examiner

*Primary Examiner* — Cassandra F Cox
(74) *Attorney, Agent, or Firm* — Rajeev Madnawat

(57) ABSTRACT

A clock glitch alerting circuit is configured to detect a glitch in an input clock signal, and activate and provide an alert signal to a security controller when the glitch is detected. The clock glitch alerting circuit is further configured to delay the input clock signal based on multiple selection signals, and provide one of a delayed clock output signal and a filtered clock output signal to the security controller based on the alert signal. The clock glitch alerting circuit is further configured to generate and provide a count value to the security controller that indicates a time duration available by the security controller to execute a security critical operation after receiving the activated alert signal.

20 Claims, 11 Drawing Sheets

CLOCK GLITCH ALERTING CIRCUIT

BACKGROUND

The present disclosure relates generally to electronic circuits, and, more particularly, to a clock glitch alerting circuit.

Glitch attacks are well known methods for introducing a glitch in a clock signal, i.e., an abrupt change in a frequency of the clock signal, on a system-on-chip (SoC). Such attacks result in corruption of secure information of the SoC or cause damage to components of the SoC that operate on the clock signal with the glitch. To detect such glitch attacks and provide a glitch indication, a clock glitch indicating circuit is implemented in the SoC.

A conventional clock glitch indicating circuit monitors a clock signal to detect whether the clock signal has a glitch. Based on the detection of the glitch, the clock glitch indicating circuit generates an indication signal and provides the indication signal to a security controller of the SoC. However, as the security controller receives the clock signal with the glitch either with the indication signal or after receiving the indication signal, the security controller may be unable to execute a security critical operation. Since the security controller is unable to execute the security critical operation before receiving the clock signal with the glitch, the glitch thus affects a functionality of the security controller. Hence, there is a need for a technical solution that solves the aforementioned problems of the conventional clock glitch indicating circuit.

SUMMARY

In one embodiment, a clock glitch alerting circuit is disclosed. The clock glitch alerting circuit includes a glitch detector, a clock delay circuit, and a glitch timing circuit. The glitch detector is configured to receive an input clock signal, and generate and provide an alert signal to a security controller that is coupled with the clock glitch alerting circuit. The alert signal is activated when the input clock signal has a glitch. The clock delay circuit is configured to receive a plurality of selection signals and the input clock signal, delay the input clock signal based on a set of delay values to output and provide a delayed clock output signal to the security controller. The set of delay values are based on the plurality of selection signals. After the activated alert signal is provided, the delayed clock output signal with the glitch is provided to the security controller. The glitch timing circuit is coupled with the clock delay circuit, and configured to receive the input clock signal, the delayed clock output signal, a logic high signal, and an enable signal, and generate and provide a count value to the security controller. The count value indicates a delay duration between providing the activated alert signal and the delayed clock output signal with the glitch to the security controller.

In another embodiment, a clock glitch alerting circuit is disclosed. The clock glitch alerting circuit includes a glitch detector, a clock delay and gating circuit, and a glitch timing circuit. The glitch detector is configured to receive an input clock signal, and generate and provide an alert signal to a security controller that is coupled with the clock glitch alerting circuit. The alert signal is activated when the input clock signal has a glitch. The clock delay and gating circuit is coupled with the glitch detector, and configured to receive a plurality of selection signals, the alert signal, an acknowledgement signal, and the input clock signal, delay the input clock signal based on a set of delay values to output a delayed clock output signal, and generate and provide, based on the alert signal, the delayed clock output signal, and the acknowledgement signal, a filtered clock output signal to the security controller. The set of delay values are based on the plurality of selection signals. The filtered clock output signal is provided to the security controller based on the acknowledgement signal. The glitch timing circuit is coupled with the clock delay and gating circuit, and configured to receive the input clock signal, the delayed clock output signal, a logic high signal, and a first enable signal, and generate and provide a count value to the security controller. The count value indicates a time duration available by the security controller to execute a security critical operation after receiving the activated alert signal. The security critical operation is executed based on the filtered clock output signal.

In yet another embodiment, a clock glitch alerting circuit is disclosed. The clock glitch alerting circuit includes a glitch detector, delay circuitry, and a glitch timing circuit. The glitch detector is configured to receive an input clock signal, and generate and provide an alert signal to a security controller that is coupled with the clock glitch alerting circuit. The alert signal is activated when the input clock signal has a glitch. The delay circuitry is configured to receive a plurality of selection signals and the input clock signal, delay the input clock signal based on the plurality of selection signals to generate a delayed clock output signal, and output and provide one of the delayed clock output signal and a filtered clock output signal to the security controller. The delayed clock output signal with the glitch is provided after the activated alert signal is provided to the security controller. The filtered clock output signal is outputted based on the delayed clock output signal. The glitch timing circuit is coupled with the delay circuitry, and configured to receive the input clock signal, the delayed clock output signal, a logic high signal, and a first enable signal, and generate and provide a count value to the security controller. The count value indicates a time duration available by the security controller to execute a security critical operation after receiving the activated alert signal. The security critical operation is executed based on one of the delayed clock output signal and the filtered clock output signal.

In some embodiments, the clock glitch alerting circuit further comprises a decoder that is coupled with the clock delay circuit, and configured to receive one of a configuration signal and a fixed bit signal, and generate and provide the plurality of selection signals to the clock delay circuit based on one of the configuration signal and a fixed bit signal. The plurality of selection signals are based on a delay duration that is indicated by the configuration signal.

In some embodiments, the clock glitch alerting circuit further comprises a configuration register that is coupled with the decoder and the glitch timing circuit, and configured to receive configuration data, generate the configuration signal and the enable signal, and provide the configuration signal to the decoder and the enable signal to the glitch timing circuit. When the enable signal is activated, the clock delay circuit receives the input clock signal, and the configuration data is provided by the security controller.

In some embodiments, the clock delay circuit comprises a plurality of delay pairs that are configured to output the delayed clock output signal. Each delay pair of the plurality of delay pairs includes a delay element and a multiplexer. Further, the multiplexer of a corresponding delay pair of the plurality of delay pairs is coupled with the delay element of the corresponding delay pair.

In some embodiments, the delay element of each delay pair of the plurality of delay pairs is configured to receive a first input signal and generate a corresponding delayed first input signal of a plurality of delayed first input signals, and the multiplexer of each delay pair of the plurality of delay pairs is configured to receive a corresponding selection signal of the plurality of selection signals, the corresponding delayed first input signal, and the first input signal. The multiplexer of each delay pair of the plurality of delay pairs, is further configured to select and output, based on the corresponding selection signal, one of the corresponding delayed first input signal and the first input signal. The first input signal is one of the input clock signal and a corresponding output of a previous multiplexer of a previous delay pair of the plurality of delay pairs.

In some embodiments, the glitch timing circuit comprises first and second flip-flops, a logic gate, and a counter. The first flip-flop is configured to receive the logic high signal at an input terminal, the enable signal at an inverted reset terminal, and the input clock signal at a clock terminal, and generate a first flop-output signal at an output terminal thereof. The second flip-flop is coupled with the clock delay circuit, and configured to receive the logic high signal at an input terminal, the enable signal at an inverted reset terminal, and the delayed clock output signal at a clock terminal, and generate a second flop-output signal at an output terminal thereof. The logic gate is coupled with the output terminals of the first and second flip-flops, and configured to receive the first and second flop-output signals and generate a logic output signal. The counter is coupled with the logic gate, and configured to receive the logic output signal, the enable signal, and the input clock signal, and generate and provide the count value to the security controller.

In some embodiments, when the logic output signal and the enable signal are at logic high states, the counter is configured to count a number of cycles of the input clock signal, and the count value is generated based on the counted number of cycles.

In some embodiments, the clock glitch alerting circuit further comprises a configuration register, a decoder, and a combinational logic circuit. The configuration register is configured to receive configuration data, and generate the first enable signal, a second enable signal, and a configuration signal. A decoder is coupled with the configuration register, and configured to receive the configuration signal, and generate a plurality of decoded configuration signals. The combinational logic circuit is coupled with the configuration register, the decoder, and the clock delay and gating circuit, and configured to receive the plurality of decoded configuration signals and the first enable signal, and generate the plurality of selection signals.

In some embodiments, the clock glitch alerting circuit further comprises a delay array and a second logic gate. The delay array is coupled with the configuration register, and configured to receive the second enable signal and a first clock signal, and delay the first clock signal based on the second enable signal to generate a test clock signal. The second logic gate is coupled with the delay array, and configured to receive the test clock signal and the first clock signal, and generate a second clock signal.

In some embodiments, the clock glitch alerting circuit further comprises a first multiplexer that is coupled with the configuration register, the second logic gate, and the clock delay and gating circuit, and configured to receive the second enable signal, the second clock signal, and the first clock signal, and select and provide, based on the second enable signal, one of the second clock signal and the first clock signal as the input clock signal to the clock delay and gating circuit.

In some embodiments, the glitch timing circuit comprises first and second flip-flops, a third logic gate, and a first counter. The first flip-flop is coupled with the configuration register and the first multiplexer, and configured to receive the logic high signal at an input terminal, the input clock signal at a clock terminal, and the first enable signal at an inverted reset terminal, and generate a first flop-output signal at an output terminal thereof. The second flip-flop is coupled with the clock delay and gating circuit and the configuration register, and configured to receive the logic high signal at an input terminal, the delayed clock output signal at a clock terminal, and the first enable signal at an inverted reset terminal, and generate a second flop-output signal at an output terminal thereof. The third logic gate is coupled with the output terminals of the first and second flip-flops, and configured to receive the first and second flop-output signals and generate a logic output signal. The first counter is coupled with the configuration register and the third logic gate, and configured to receive the logic output signal, the first enable signal, and the input clock signal, and generate and provide the count value to the security controller.

In some embodiments, when the logic output signal and the first enable signal are at logic high states, the first counter is configured to count a number of cycles of the input clock signal, and the count value is generated based on the counted number of cycles.

In some embodiments, the clock glitch alerting circuit further comprises the fourth logic gate that is coupled with the third logic gate, and configured to receive the logic output signal and generate and provide a valid signal to the security controller. The valid signal indicates that the count value provided to the security controller is valid.

In some embodiments, the clock delay and gating circuit comprises a clock delay circuit and a clock gating circuit. The clock delay circuit is configured to receive the plurality of selection signals and the input clock signal, and delay the input clock signal based on the set of delay values to output the delayed clock output signal. The clock gating circuit is coupled with the clock delay circuit and the glitch detector, and configured to receive the delayed clock output signal, the alert signal, and the acknowledgement signal, and generate and provide the filtered clock output signal to the security controller.

In some embodiments, the clock delay circuit comprises a plurality of delay pairs that are configured to output the delayed clock output signal. Each delay pair of the plurality of delay pairs includes a delay element and a multiplexer, and the multiplexer of a corresponding delay pair of the plurality of delay pairs is coupled with the delay element of the corresponding delay pair and a corresponding logic gate of the combinational logic circuit.

In some embodiments, the delay element of each delay pair of the plurality of delay pairs is configured to receive a first input signal and generate a corresponding delayed first input signal of a plurality of delayed first input signals, and the multiplexer of each delay pair of the plurality of delay pairs is configured to receive a corresponding selection signal of the plurality of selection signals, the corresponding delayed first input signal, and the first input signal. The multiplexer of each delay pair of the plurality of delay pairs is further configured to select and output based on the corresponding selection signal, one of the corresponding delayed first input signal and the first input signal. Further, the first input signal is one of the input clock signal and a corresponding output of a previous multiplexer of a previous delay pair of the plurality of delay pairs.

In some embodiments, the clock gating circuit comprises a glitch filter and a clock acknowledgement circuit. The glitch filter is coupled with the glitch detector and the clock delay circuit, and configured to receive the alert signal and the delayed clock output signal, and generate the filtered clock output signal. The clock acknowledgement circuit is coupled with the glitch filter, and configured to receive the filtered clock output signal and the acknowledgement signal, and output and provide the filtered clock output signal to the security controller based on the acknowledgement signal.

In some embodiments, the clock gating circuit comprises a glitch filter, a second counter, a third logic gate, and a clock acknowledgement circuit. The glitch filter is coupled with the glitch detector and the clock delay circuit, and configured to receive the alert signal and the delayed clock output signal, and generate the filtered clock output signal. The second counter is coupled with the glitch detector, and configured to receive the alert signal, and generate an expiry signal. The second counter activates the expiry signal after a predetermined time duration that is initiated based on the reception of the activated alert signal. The third logic gate is coupled with the second counter, and configured to receive the expiry signal and the acknowledgement signal, and generate a disable signal. The acknowledgement signal indicates an execution of a security operation by the security controller based on the alert signal, and the disable signal is activated when one of the expiry signal is activated and the acknowledgement signal is activated. The clock acknowledgement circuit is coupled with the glitch filter and the combinational logic circuit, and configured to receive the filtered output signal and the disable signal, and output and provide the filtered clock output signal to the security controller. The filtered clock output signal is provided when the disable signal is activated, and the filtered clock output signal is gated when the disable signal is deactivated.

In some embodiments, the clock glitch alerting circuit further comprises a diagnostic register that is coupled with the glitch detector and the second counter, and configured to receive the alert signal, the acknowledgement signal, and the expiry signal, and store information associated with the alert signal, the acknowledgement signal, and the expiry signal.

In some embodiment, the delay circuitry is coupled with the glitch detector, and further configured to receive the alert signal and an acknowledgement signal. The acknowledgement signal is provided by the security controller to the delay circuitry. The delay circuitry provides the filtered clock output signal to the security controller further based on the alert signal and the acknowledgement signal.

Various embodiments of the present disclosure disclose a clock glitch alerting circuit of a system-on-chip (SoC). The clock glitch alerting circuit is configured to detect a glitch in an input clock signal and activate and provide an alert signal to a security controller of the SoC when the glitch is detected. The clock glitch alerting circuit is further configured to delay the input clock signal by a set of delay values. The clock glitch alerting circuit is further configured to provide a delayed version of the input clock signal to the security controller based on the alert signal. The clock glitch alerting circuit is further configured to generate and provide a count value to the security controller that indicates a delay duration between providing the alert signal and the delayed version of the input clock signal to the security controller.

As the security controller receives the count value and the alert signal, the security controller is capable of utilizing the delay duration after the reception of the alert signal to react to the glitch in the input clock signal by executing a security critical operation. The execution of the security critical operation during the delay duration prevents corruption of secure information of the SoC as well as damage to components of the SoC. Thus, the security controller is able to timely react to the glitch before the delayed version of the input clock signal reaches the security controller.

BRIEF DESCRIPTION OF THE DRAWINGS

The following detailed description of the preferred embodiments of the present disclosure will be better understood when read in conjunction with the appended drawings. The present disclosure is illustrated by way of example, and not limited by the accompanying figures, in which like references indicate similar elements.

DETAILED DESCRIPTION

The detailed description of the appended drawings is intended as a description of the currently preferred embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

Figure 1:
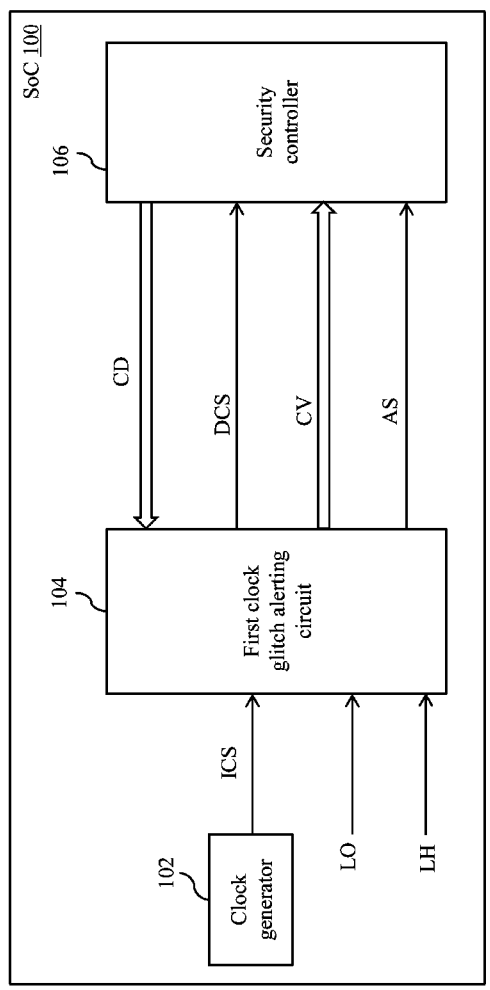
FIG. 1 is a block diagram of a system-on-chip (SoC) in accordance with an embodiment of the present disclosure.

FIG. 1 is a block diagram of a system-on-chip (SoC) 100 in accordance with an embodiment of the present disclosure. The SoC 100 may be utilized in security related applications that require secure on-chip or off-chip communication, automotive applications, and industrial applications. The SoC 100 includes a clock generator 102, a first clock glitch alerting circuit 104, and a security controller 106.

The clock generator 102 is configured to generate an input clock signal ICS. The clock generator 102 is coupled with the first clock glitch alerting circuit 104, and further configured to provide the input clock signal ICS to the first clock glitch alerting circuit 104. The clock generator 102 may be an oscillator.

The first clock glitch alerting circuit 104 is coupled with the clock generator 102 and the security controller 106. The first clock glitch alerting circuit 104 is configured to receive the input clock signal ICS, a logic low signal LO, and a logic high signal LH, and generate delayed version of the input clock signal ICS, hereinafter referred to as "a delayed clock output signal DCS", an alert signal AS, and a count value CV. The SoC 100 further includes a signal generator (not shown) that is coupled with the first clock glitch alerting circuit 104, and configured to generate and provide the logic low signal LO and the logic high signal LH to the first clock glitch alerting circuit 104. In one embodiment, the first clock glitch alerting circuit 104 is further configured to receive configuration data CD from the security controller 106. The configuration data CD indicates to the first clock glitch alerting circuit 104, a delay duration by which the input clock signal ICS needs to be delayed.

To generate the alert signal AS, the first clock glitch alerting circuit 104 is configured to detect, i.e., monitor, a glitch in the input clock signal ICS and provide an instant notification to the security controller 106 by way of the alert signal AS. In the presently preferred embodiment, the alert signal AS is activated when the input clock signal ICS has a glitch. Further, the alert signal AS and the delayed clock output signal DCS are generated such that the delayed clock output signal DCS with the glitch is provided to the security controller 106 after the alert signal AS is provided. Thus, the security controller 106 is notified that the delayed clock output signal DCS has the glitch before the glitch reaches the security controller 106, i.e., the glitch reaches the security controller 106 after the delay duration that is indicated by the count value CV. The structure and working of the first clock glitch alerting circuit 104 of FIG. 1 are described in detail in conjunction with FIGS. 2-4.

The security controller 106 is coupled with the first clock glitch alerting circuit 104, and configured to receive the delayed clock output signal DCS, the alert signal AS, and the count value CV. The security controller 106 receives the alert signal AS before the delayed clock output signal DCS with the glitch. In one embodiment, the security controller 106 is further configured to generate the configuration data CD. As the count value CV indicates to the security controller 106 the delay duration between providing the activated alert signal AS and the delayed clock output signal DCS with the glitch, i.e., a time to breach parameter, the security controller 106 thus utilizes the time to breach duration to determine a reaction to the glitch and execute a security critical operation. The security critical operation is thus executed based on the delayed clock output signal DCS, i.e., the security controller 106 operates on the delayed clock output signal DCS to executed the security critical operation. In one example, the security critical operation includes resetting the SoC 100. In another example, the security critical operation includes preventing secure information of the SoC 100 from being corrupted by storing the secure information at a secure location. Examples of the security controller 106 includes a reset control circuit, a fault collection and control circuit, and the like.

Figure 2:
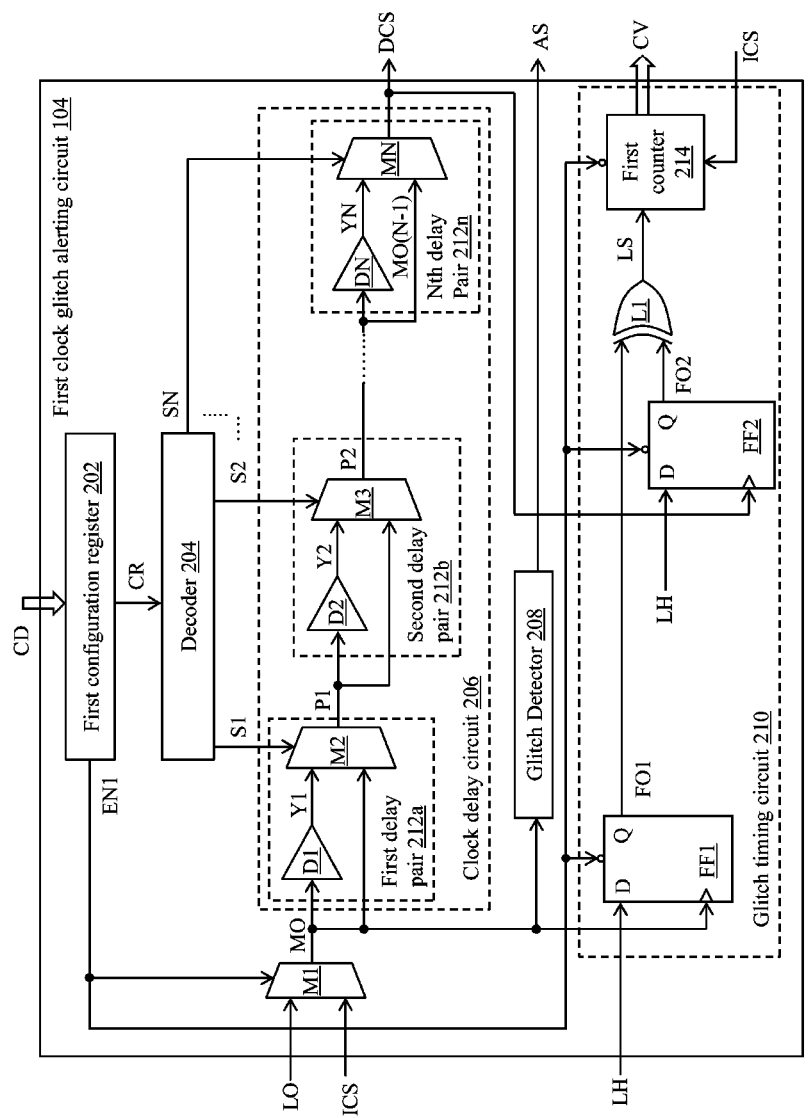
FIG. 2 is a schematic block diagram of a first clock glitch alerting circuit of the SoC of FIG. 1 in accordance with an embodiment of the present disclosure.

FIG. 2 is a schematic block diagram of the first clock glitch alerting circuit 104 in accordance with an embodiment of the present disclosure. The first clock glitch alerting circuit 104 includes a first configuration register 202, a decoder 204, a first multiplexer M1, delay circuitry 206, i.e., a clock delay circuit 206, a glitch detector 208, and a glitch timing circuit 210.

The first configuration register 202 is coupled with the decoder 204, the glitch timing circuit 210, and the security controller 106. The first configuration register 202 is configured to receive the configuration data CD, generate a configuration signal CR and a first enable signal EN1, and provide the configuration signal CR to the decoder 204, and the first enable signal EN1 to the glitch timing circuit 210. The configuration data CD is provided by the security controller 106. The configuration signal CR is generated based on the delay duration indicated by the configuration data CD. The first enable signal EN1 is generated based on the indication provided by the configuration data CD to initiate the detection of the glitch in the input clock signal ICS. In one embodiment, the first configuration register 202 activates or deactivates the first enable signal EN1 based on the configuration data CD. The first configuration register 202 activates the first enable signal EN1 when the configuration data CD indicates to initiate the detection of the glitch in the input clock signal ICS.

The decoder 204 is coupled with the clock delay circuit 206. The decoder 204 is configured to receive the configuration signal CR, and generate and provide a plurality of selection signals S1, S2, . . . , SN to the clock delay circuit 206 based on the configuration signal CR. The plurality of selection signals S1, S2, . . . , SN are based on the delay duration that is indicated by the configuration signal CR. The decoder 204 activates or deactivates each selection signal of the plurality of selection signals S1, S2, . . . , SN based on the delay duration. In one example, the delay duration is directly proportional to a number of selection signals of the plurality of selection signals S1, S2, . . . , SN deactivated by the decoder 204.

The first multiplexer M1 is configured to receive the logic low signal LO and the input clock signal ICS. When the first enable signal EN1 is deactivated, the first multiplexer M1 selects and outputs the logic low signal LO as a multiplexer output signal MO. When the first enable signal EN1 is activated, the first multiplexer M1 selects and outputs the input clock signal ICS as the multiplexer output signal MO. In other words, when the first enable signal EN1 is activated, the first clock glitch alerting circuit 104 is configured to detect the glitch in the input clock signal ICS. For the sake of ongoing discussion and without limiting the scope of the disclosure, it is assumed that the input clock signal ICS has the glitch and the first enable signal EN1 is activated.

The clock delay circuit 206 is coupled with the first multiplexer M1 and the decoder 204. The clock delay circuit 206 includes a plurality of delay pairs 212*a*, 212*b*, . . . , 212*n* that are configured to generate and output the delayed clock output signal DCS. In the presently preferred embodiment, the clock delay circuit 206 receives the input clock signal ICS as the multiplexer output signal MO. Each delay pair of the plurality of delay pairs 212*a*, 212*b*, . . . , 212*n* includes a delay element and a multiplexer. The multiplexer of a corresponding delay pair of the plurality of delay pairs 212*a*, 212*b*, . . . , 212*n* is coupled with the delay element of the corresponding delay pair. The multiplexer of the corresponding delay pair of the plurality of delay pairs 212*a*, 212*b*, . . . , 212*n* is further coupled with one of the first multiplexer M1 and a previous multiplexer of a previous delay pair of the plurality of delay pairs 212a, 212b, ..., 212n.

The delay element of each delay pair of the plurality of delay pairs 212a, 212b, ..., 212n is configured to receive a first input signal and generate a corresponding delayed first input signal of a plurality of delayed first input signals Y1, Y2, ..., YN. To generate the corresponding delayed first input signal, the delay element of each delay pair is further configured to delay the first input signal by a corresponding delay value. Further, the multiplexer of each delay pair of the plurality of delay pairs 212a, 212b, ..., 212n is configured to receive a corresponding selection signal of the plurality of selection signals S1, S2, SN at a select terminal thereof, and the corresponding delayed first input signal, and the first input signal at first and second input terminals, respectively. The multiplexer of each delay pair of the plurality of delay pairs 212a, 212b, ..., 212n, selects and outputs based on the corresponding selection signal, one of the corresponding delayed first input signal and the first input signal at an output terminal thereof. The first input signal is one of the input clock signal ICS and a corresponding output of the previous multiplexer.

The first delay pair 212a includes a first delay element D1 and a second multiplexer M2. The first delay element D1 is coupled with the first multiplexer M1, and configured to receive the input clock signal ICS as the multiplexer output signal MO, i.e., the first input signal. The first delay element D1 is further configured to delay the input clock signal ICS by a first delay value and generate the corresponding delayed first input signal, i.e., a delayed version of the input clock signal ICS, hereinafter referred to as a "delayed input clock signal Y1".

The second multiplexer M2 is coupled with the first delay element D1 and the first multiplexer M1, and configured to receive the delayed input clock signal Y1 and the input clock signal ICS at first and second input terminals, respectively. The second multiplexer M2 is further coupled with the decoder 204, and configured to receive a first selection signal S1 of the plurality of selection signals S1, S2, ..., SN at a select terminal thereof. The second multiplexer M2 is further configured to select and output one of the delayed input clock signal Y1 (i.e., the corresponding delayed first input signal) and the input clock signal ICS (i.e., the first input signal), as a first multiplexed output signal P1 at an output terminal thereof.

The second delay pair 212b includes a second delay element D2 and a third multiplexer M3. The second delay element D2 is coupled with the second multiplexer M2, and configured to receive the first multiplexed output signal P1 as the first input signal. The second delay element D2 is further configured to delay the first multiplexed output signal P1 by a second delay value and generate the corresponding delayed first input signal, i.e., a delayed version of the first multiplexed output signal P1, hereinafter referred to as a "delayed first multiplexed output signal Y2".

The third multiplexer M3 is coupled with the second delay element D2 and the second multiplexer M2, and configured to receive the delayed first multiplexed output signal Y2 and the first multiplexed output signal P1 at first and second input terminals, respectively. The third multiplexer M3 is further coupled with the decoder 204, and configured to receive a second selection signal S2 of the plurality of selection signals S1, S2, ..., SN at a select terminal thereof. The third multiplexer M3 is further configured to select and output one of the delayed first multiplexed output signal Y2 (i.e., the corresponding delayed first input signal), and the first multiplexed output signal P1 (i.e., the first input signal), as a second multiplexed output signal P2 at an output terminal thereof.

The Nth delay pair 212n includes an Nth delay element DN and an Nth multiplexer MN. The Nth delay element DN is coupled with an (N−1)th multiplexer (not shown), and configured to receive an (N−1)th multiplexed output signal (not shown) as the first input signal. The Nth delay element DN is further configured to delay the (N−1)th multiplexed output signal by a third delay value and generate the corresponding delayed first input signal, i.e., a delayed version of the (N−1)th multiplexed output signal, hereinafter referred to as a "delayed Nth output signal YN". In one embodiment, the first through third delay values are same. In another embodiment, the first through third delay values are different.

The Nth multiplexer MN is coupled with the Nth delay element DN and the (N−1)th multiplexer, and configured to receive the delayed Nth output signal YN and the (N−1)th multiplexed output signal at first and second input terminals, respectively. The Nth multiplexer MN is further coupled with the decoder 204, and configured to receive an Nth selection signal SN of the plurality of selection signals S1, S2, ..., SN at a select terminal thereof. The Nth multiplexer MN is further configured to select and output one of the delayed Nth output signal YN (i.e., the corresponding delayed first input signal), and the (N−1)th multiplexed output signal (i.e., the first input signal), as the delayed clock output signal DCS at an output terminal thereof. Based on the plurality of selection signals S1, S2, ..., SN, the multiplexer of each delay pair of the plurality of delay pairs 212a, 212b, ..., 212n selects one of the corresponding delayed first input signal generated by the delay element or the first input signal. Thus, the clock delay circuit 206 delays the input clock signal ICS by the set of delay values (such as at least one of the first through third delay values) to generate the delayed clock output signal DCS. In one example, when the first and second selection signals S1 and S2 of the plurality of selection signals S1, S2, ..., SN are deactivated and the remaining selection signals of the plurality of selection signals S1, S2, ..., SN are activated, the clock delay circuit 206 delays the input clock signal ICS by the first and second delay values to generate the delayed clock output signal DCS.

The glitch detector 208 is coupled with the first multiplexer M1, and configured to receive the input clock signal ICS by way of the multiplexer output signal MO, detect a glitch in the input clock signal ICS, and generate and provide the alert signal AS to the security controller 106. In the presently preferred embodiment, the glitch detector 208 activates the alert signal AS when the input clock signal ICS has the glitch. When the input clock signal ICS is glitch free, the glitch detector 208 does not activate the alert signal AS (i.e., the alert signal AS remains deactivated).

The glitch timing circuit 210 is coupled with the clock delay circuit 206, and configured to receive the input clock signal ICS, the delayed clock output signal DCS, the logic high signal LH, and the first enable signal EN1, and generate and provide the count value CV to the security controller 106. The glitch timing circuit 210 includes first and second flip-flops FF1 and FF2, a first logic gate L1, and a first counter 214.

The first flip-flop FF1 is configured to receive the logic high signal LH at an input terminal, the first enable signal EN1 at an inverted reset terminal, and the input clock signal ICS at a clock terminal, and generate a first flop-output signal FO1 at an output terminal thereof. The second flip-flop FF2 is coupled with the clock delay circuit 206, and configured to receive the logic high signal LH at an input terminal, the first enable signal EN1 at an inverted reset terminal, and the delayed clock output signal DCS at a clock terminal, and generate a second flop-output signal FO2 at an output terminal thereof. In an embodiment, the first and second flip-flops FF1 and FF2 are D flip-flops.

The first logic gate L1 is coupled with the output terminals of the first and second flip-flops FF1 and FF2, and configured to receive the first and second flop-output signals FO1 and FO2 and generate a logic output signal LS. In an embodiment, the first logic gate L1 is an exclusive-OR (ex-OR) gate.

The first counter 214 is coupled with the first logic gate L1, and configured to receive the logic output signal LS, the first enable signal EN1, and the input clock signal ICS, and generate and provide the count value CV to the security controller 106. When the logic output signal LS and the first enable signal EN1 are at logic high states, the first counter 214 is configured to count a number of cycles of the input clock signal ICS. The count value CV is thus generated based on the counted number of cycles.

When the first multiplexer M1 selects and outputs the input clock signal ICS as the multiplexer output signal MO, the first flip-flop FF1 receives the input clock signal ICS at the clock terminal thereof and generates the first flop-output signal FO1 at logic high state. Simultaneously, as the second flip-flop FF2 has not received the delayed clock output signal DCS, the second flip-flop FF2 generates the second flop-output signal FO2 at logic low state. Thus, the first logic gate L1 receives the first and second flop-output signals FO1 and FO2 at logic high state and logic low state, respectively, and generates the logic output signal LS at logic high state. On receiving the logic output signal LS at logic high state, the first counter 214 initiates counting of cycles of the input clock signal ICS. When the clock delay circuit 206 generates the delayed clock output signal DCS, the second flip-flop FF2 receives the delayed clock output signal DCS at the clock terminal thereof and generates the second flop-output signal FO2 at logic high state. Thus, the first logic gate L1 receives the first and second flop-output signals FO1 and FO2 at logic high states and generates the logic output signal LS at logic low state. On receiving the logic output signal LS at logic low state, the first counter 214 terminates counting of the cycles of the input clock signal ICS. The first counter 214 generates the count value CV based on the number of number of cycles of the input clock signal ICS counted by the first counter 214, i.e., the cycles between generating the logic output signal LS at logic high state and logic low state. In one embodiment, the time to breach parameter indicated by the count value CV corresponds to the number of cycles of the input clock signal ICS, for example, the time to breach parameter is '3' cycles of the input clock signal ICS. In another embodiment, the time to breach parameter indicated by the count value CV corresponds to a time period determined based on the number of cycles of the input clock signal ICS, for example, the time to breach parameter is '3' nanoseconds.

When the first multiplexer M1 selects and outputs the logic low signal LO as the multiplexer output signal MO, the first flip-flop FF1 receives the logic low signal LO at the clock terminal thereof and generates the first flop-output signal FO1 at logic low state. Simultaneously, the second flip-flop FF2 receives the logic low signal LO at the clock terminal thereof and generates the second flop-output signal FO2 at logic low state. Thus, the first logic gate L1 receives the first and second flop-output signals FO1 and FO2 at logic low states and generates the logic output signal LS at logic low state. The first counter 214 receives the logic output signal LS at logic low state and is non-operational.

Figure 3:
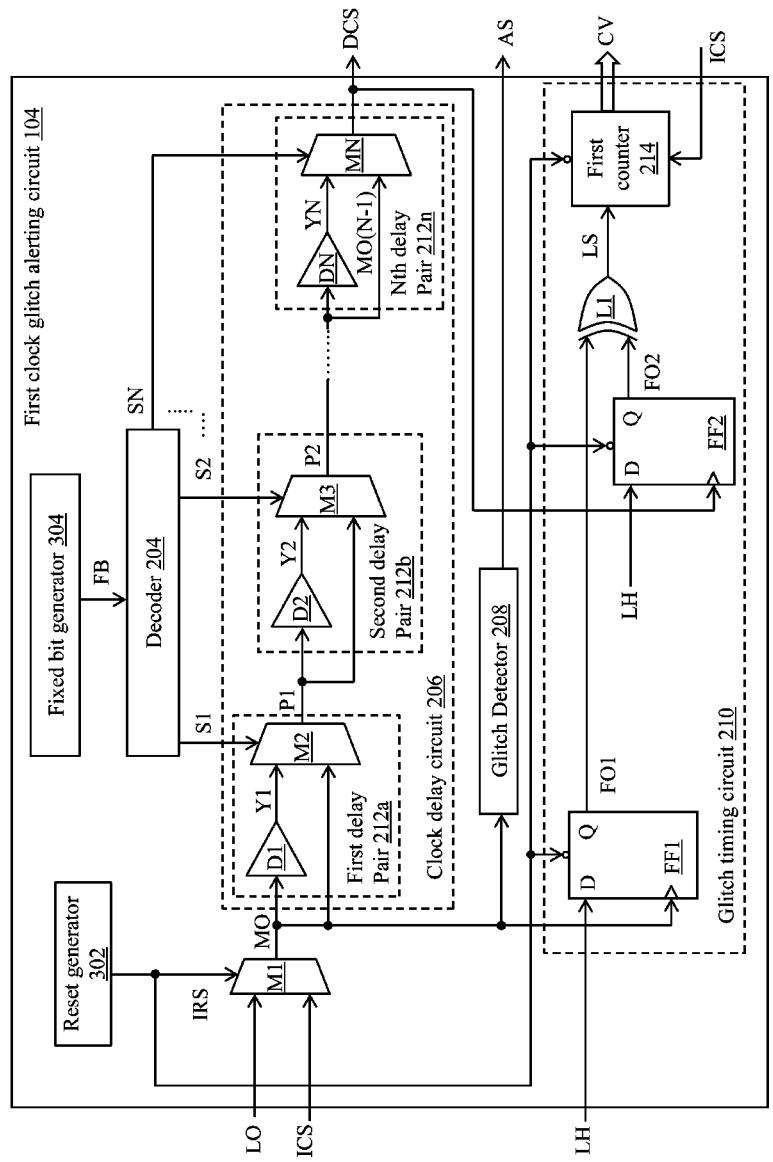
FIG. 3 is a schematic block diagram of the first clock glitch alerting circuit of the SoC of FIG. 1 in accordance with another embodiment of the present disclosure.

FIG. 3 is a schematic block diagram of the first clock glitch alerting circuit 104 in accordance with another embodiment of the present disclosure. The first clock glitch alerting circuit 104 includes a reset generator 302, a fixed-bit generator 304, the decoder 204, the first multiplexer M1, the clock delay circuit 206, the glitch detector 208, and the glitch timing circuit 210.

The reset generator 302 is coupled with the first multiplexer M1 and the glitch timing circuit 210, and configured to generate an inverted reset signal IRS and provide the inverted reset signal IRS to the first multiplexer M1 and the glitch timing circuit 210. The inverted reset signal IRS indicates an initiation of the detection of the glitch in the input clock signal ICS. The reset generator 302 activates the inverted reset signal IRS to initiate the detection of the glitch in the input clock signal ICS. The fixed-bit generator 304 is coupled with the decoder 204, and configured to generate a fixed-bit signal FB based on a bit value stored in the fixed-bit generator 304. The fixed-bit signal FB indicates the delay duration by which the input clock signal ICS needs to be delayed.

The decoder 204 is configured to receive the fixed-bit signal FB, and generate and provide the plurality of selection signals S1, S2, . . . , SN to the clock delay circuit 206 based on the fixed-bit signal FB. The plurality of selection signals S1, S2, . . . , SN are based on the delay duration that is indicated by the fixed-bit signal FB. The decoder 204 activates or deactivates each selection signal of the plurality of selection signals S1, S2, . . . , SN based on the delay duration. In one example, the delay duration is directly proportional to a number of selection signals of the plurality of selection signals S1, S2, . . . , SN deactivated by the decoder 204.

The first multiplexer M1 is configured to receive the logic low signal LO and the input clock signal ICS. When the inverted reset signal IRS is deactivated, the first multiplexer M1 selects and outputs the logic low signal LO as the multiplexer output signal MO. When the inverted reset signal IRS is activated, the first multiplexer M1 selects and outputs the input clock signal ICS as the multiplexer output signal MO. The clock delay circuit 206, the glitch detector 208, and the glitch timing circuit 210 function in a manner similar as described in FIG. 2.

Figure 4:
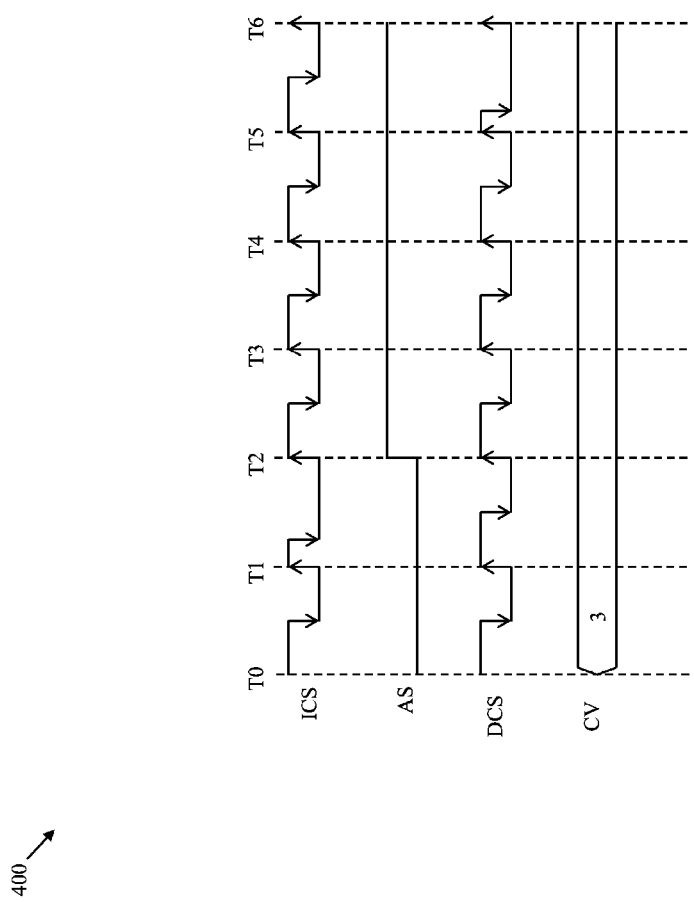
FIG. 4 is a timing diagram that illustrates an operation of the first clock glitch alerting circuit of FIGS. 2 and 3 in accordance with an embodiment of the present disclosure.

FIG. 4 is a timing diagram 400 that illustrates an operation of the first clock glitch alerting circuit 104 of FIGS. 2 and 3 in accordance with an embodiment of the present disclosure. In one example, a frequency of the input clock signal ICS is one giga-hertz (GHz).

During time period T0-T1, the input clock signal ICS completes one cycle, the delayed clock output signal DCS completes one corresponding clock cycle (i.e., a delayed clock cycle that corresponds to a corresponding previous clock cycle of the input clock signal ICS that is determined by the set of delay values), the alert signal AS is at logic low state, and the count value CV is '3'. In presently preferred embodiment, the time to breach parameter indicated by the count value CV corresponds to the number of cycles of the input clock signal ICS.

During time period T1-T2, the glitch is introduced in the input clock signal ICS. In one embodiment, the frequency of the input clock signal ICS changes abruptly due to the introduced glitch. In one example, the frequency of the input clock signal ICS changes from one GHz to five GHz. The delayed clock output signal DCS completes one cycle and the count value CV is '3'. The glitch detector 208 receives the input clock signal ICS with the glitch, detects the glitch in the input clock signal ICS, and activates the alert signal AS. Thus, at time instance T2, the alert signal AS transitions from logic low state to logic high state.

During time period T2-T3, the input clock signal ICS completes one cycle, the delayed clock output signal DCS completes one cycle, the alert signal AS remains at logic high state, and the count value CV is '3'. The security controller 106 receives the activated alert signal AS and the count value CV that indicates to the security controller 106 that the security controller 106 will receive the delayed clock output signal DCS with the glitch after '3' clock cycles. Thus, the first clock glitch alerting circuit 104 provides an early indication to the security controller 106 of the upcoming glitch.

During time period T3-T5, the input clock signal ICS completes two cycles, the delayed clock output signal DCS completes two cycles, the alert signal AS remains at logic high state, and the count value CV is '3'. Based on the indication received by way of the alert signal AS, the security controller 106 determines the reaction and initiates an execution of the security critical operation.

During time period T5-T6, the input clock signal ICS completes one cycle, the alert signal AS remains at logic high state, and the count value CV is '3'. The security controller 106 receives the delayed clock output signal DCS with the glitch. As the security controller 106 has completed the execution of the security critical operation, the security controller 106 is thus unaffected by the glitch on the delayed clock output signal DCS.

Figure 5:
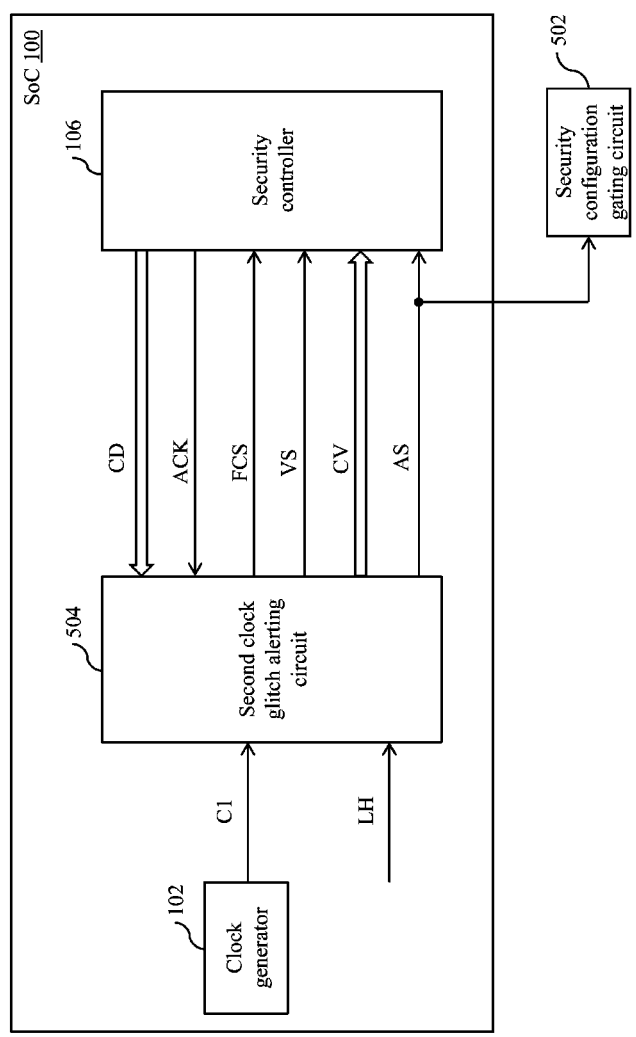
FIG. 5 is a block diagram of the SoC of FIG. 1 that is coupled with a security configuration gating circuit in accordance with another embodiment of the present disclosure.

FIG. 5 is a block diagram of the SoC 100 that is coupled with a security configuration gating circuit 502 in accordance with another embodiment of the present disclosure. The SoC 100 includes the clock generator 102, a second clock glitch alerting circuit 504, and the security controller 106.

The clock generator 102 is configured to generate a first clock signal C1. The clock generator 102 is coupled with the second clock glitch alerting circuit 504, and further configured to provide the first clock signal C1 to the second clock glitch alerting circuit 504.

The second clock glitch alerting circuit 504 is coupled with the clock generator 102 and the security controller 106. The second clock glitch alerting circuit 504 is configured to receive the first clock signal C1 and the logic high signal LH, and generate and output a filtered clock output signal FCS, the alert signal AS, the count value CV, and a valid signal VS. The filtered clock output signal FCS is outputted based on the delayed clock output signal DCS. In one embodiment, the second clock glitch alerting circuit 504 is further configured to receive the configuration data CD and an acknowledgement signal ACK from the security controller 106. The configuration data CD indicates to the second clock glitch alerting circuit 504, the delay duration by which the first clock signal C1 needs to be delayed. The configuration data CD may further indicate the second clock glitch alerting circuit 504 to detect the glitch in the first clock signal C1. To generate the alert signal AS, the second clock glitch alerting circuit 504 is configured to detect, i.e., monitor, a glitch in the first clock signal C1 and provide an instant notification to the security controller 106 by way of the alert signal AS. In the presently preferred embodiment, the alert signal AS is activated when the first clock signal C1 has a glitch. Thus, after receiving the activated alert signal AS, the security controller 106 is notified to react to the glitch within the delay duration that is indicated by the count value CV. The valid signal VS indicates the security controller 106 that the count value CV is valid. Further, the acknowledgement signal ACK indicates an execution of a security operation by the security controller 106 based on the alert signal AS. The structure and working of the second clock glitch alerting circuit 504 of the SoC 100 of FIG. 5 are described in detail in conjunction with FIGS. 6-11.

The security controller 106 is coupled with the second clock glitch alerting circuit 504, and configured to receive the filtered clock output signal FCS, the alert signal AS, the count value CV, and the valid signal VS. In one embodiment, the security controller 106 is further configured to generate the configuration data CD and the acknowledgement signal ACK. As the count value CV indicates to the security controller 106, a time duration (i.e., the delay duration) available by the security controller 106 to execute the security critical operation after receiving the activated alert signal AS, the security controller 106 thus utilizes the time duration to determine the reaction to the glitch and execute the security critical operation. The security critical operation is executed based on the filtered clock output signal FCS, i.e., the security controller 106 operates on the filtered clock output signal FCS to executed the security critical operation. After executing the security critical operation, the security controller 106 activates the acknowledgement signal ACK.

The security configuration gating circuit 502 is coupled with the second clock glitch alerting circuit 504, and configured to receive the alert signal AS and provide the alert signal AS to another SoC (not shown) whose operation may be dependent on the SoC 100. In one embodiment, when the glitch is detected and the alert signal AS is activated, the security configuration gating circuit 502 receives and provides the activated alert signal AS to the other SoC to notify that the glitch is introduced in the input clock signal ICS.

Figure 6:
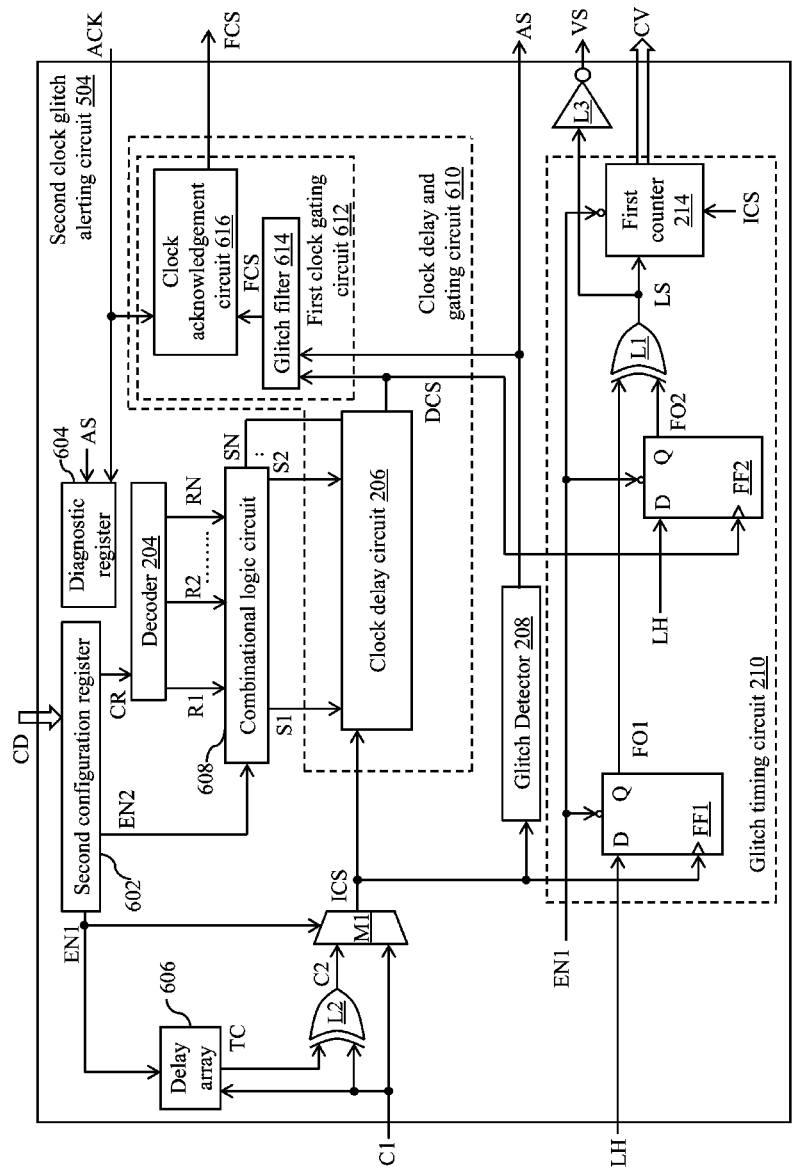
FIG. 6 is a schematic block diagram of a second clock glitch alerting circuit of the SoC of FIG. 5 in accordance with another embodiment of the present disclosure.

FIG. 6 is a schematic block diagram of the second clock glitch alerting circuit 504 of the SoC 100 of FIG. 5 in accordance with another embodiment of the present disclosure. The second clock glitch alerting circuit 504 includes a second configuration register 602, a diagnostic register 604, a delay array 606, a combinational logic circuit 608, delay circuitry 610, i.e., a clock delay and gating circuit 610, and second and third logic gates L2 and L3 in addition to the first multiplexer M1, the glitch detector 208, and the glitch timing circuit 210. The clock delay and gating circuit 610 includes the clock delay circuit 206 and a first clock gating circuit 612. The first clock gating circuit 612 includes a clock acknowledgement circuit 614 and a glitch filter 616.

The second configuration register 602 is coupled with the security controller 106, and configured to receive the configuration data CD, and generate the first enable signal EN1, a second enable signal EN2, and the configuration signal CR. The second configuration register 602 is further coupled with the decoder 204, the delay array 606, and the combinational logic circuit 608, and configured to provide the configuration signal CR, the first enable signal EN1, and the second enable signal EN2 to the decoder 204, the delay array 606, and the combinational logic circuit 608, respectively. The configuration signal CR is generated based on the delay duration indicated by the configuration data CD. The first enable signal EN1 is generated based on an indication provided by the configuration data CD to initiate a test mode operation of the second clock glitch alerting circuit 504. The test mode operation corresponds to testing of the second clock glitch alerting circuit 504 by introducing a pseudo glitch in the first clock signal C1 and determining whether the second clock glitch alerting circuit 504 is able to detect the glitch correctly and hence generate the alert signal AS to provide early indication to the security controller 106. The second enable signal EN2 is generated based on the indication provided by the configuration data CD to initiate the detection of the glitch in the first clock signal C1.

The decoder 204 is coupled with the second configuration register 602, and configured to receive the configuration signal CR, and generate a plurality of decoded configuration signals R1, R2, ..., RN. The decoder 204 generates the plurality of decoded configuration signals R1, R2, ..., RN based on the delay duration indicated by the configuration signal CR. In one embodiment, a number of decoded configuration signals of the plurality of decoded configuration signals R1, R2, ..., RN activated by the decoder 204 is inversely proportional to the delay duration. The combinational logic circuit 608 is coupled with the second configuration register 602, the decoder 204, and the clock delay and gating circuit 610. The combinational logic circuit 608 is configured to receive the plurality of decoded configuration signals R1, R2, ..., RN from the decoder 204 and the first enable signal EN1 from the second configuration register 602, and generate and provide the plurality of selection signals S1, S2, ..., SN to the clock delay and gating circuit 610. The structure and working of the combinational logic circuit 608 is described in detail in FIG. 7.

The delay array 606 is coupled with the second configuration register 602, and configured to receive the second enable signal EN2 and the first clock signal C1, and delay the first clock signal C1 based on the second enable signal EN2 to generate a test clock signal TC. The second logic gate L2 is coupled with the delay array 606, and configured to receive the test clock signal TC and the first clock signal C1, and generate a second clock signal C2. In an embodiment, the second logic gate L2 is an Ex-OR gate. The first multiplexer M1 is coupled with the second configuration register 602, the second logic gate L2, and the clock delay and gating circuit 610, and configured to receive the second enable signal EN2, the second clock signal C2, and the first clock signal C1, and select and provide, based on the second enable signal EN2, one of the second clock signal C2 and the first clock signal C1 as the input clock signal ICS to the clock delay and gating circuit 610.

The glitch detector 208 is coupled with the first multiplexer M1 and configured to receive the input clock signal ICS, and generate and provide the alert signal AS to the security controller 106. The alert signal AS is activated when the input clock signal ICS has a glitch.

The clock delay and gating circuit 610 is coupled with the glitch detector 208, the combinational logic circuit 608, and the security controller 106 and configured to receive the plurality of selection signals S1, S2, ..., SN, the alert signal AS, the acknowledgement signal ACK, and the input clock signal ICS, delay the input clock signal ICS based on a set of delay values to generate and output the delayed clock output signal DCS, and generate and provide, based on the alert signal AS, the delayed clock output signal DCS, and the acknowledgement signal ACK, the filtered clock output signal FCS to the security controller 106. The set of delay values are based on the plurality of selection signals S1, S2, ..., SN. The clock delay circuit 206 is configured to receive the plurality of selection signals S1, S2, ..., SN and the input clock signal ICS, and delay the input clock signal ICS based on the set of delay values to output the delayed clock output signal DCS.

The first clock gating circuit 612 is coupled with the clock delay circuit 206 and the glitch detector 208, and configured to receive the delayed clock output signal DCS, the alert signal AS, and the acknowledgement signal ACK, and generate and provide the filtered clock output signal FCS to the security controller 106. The glitch filter 616 is coupled with the glitch detector 208 and the clock delay circuit 206, and configured to receive the alert signal AS and the delayed clock output signal DCS, and generate the filtered clock output signal FCS. To generate the filtered clock output signal FCS, the glitch filter 616 is further configured to filter the delayed clock output signal DCS based on the alert signal AS. In one example, the glitch filter 616 filters the delayed clock output signal DCS when the alert signal AS is activated.

The clock acknowledgement circuit 614 is coupled with the glitch filter 616 and the security controller 106, and configured to receive the filtered clock output signal FCS and the acknowledgement signal ACK, and output and provide the filtered clock output signal FCS to the security controller 106 based on the acknowledgement signal ACK. In one example, the clock acknowledgement circuit 614 provides the filtered clock output signal FCS to the security controller 106 when the acknowledgement signal ACK is deactivated. The clock acknowledgement circuit 614 is further configured to gate the filtered clock output signal FCS, i.e., not provide the filtered clock output signal FCS to the security controller 106, when the acknowledgement signal ACK is activated.

The glitch timing circuit 210 is coupled with the clock delay and gating circuit 610, and configured to receive the input clock signal ICS, the delayed clock output signal DCS, the logic high signal LH, and the first enable signal EN1, and generate and provide the count value CV to the security controller 106. The count value CV indicates a time duration available by the security controller 106 to react to the glitch after receiving the activated alert signal AS. The glitch timing circuit 210 includes the first and second flip-flops FF1 and FF2, the first logic gate L1, and the first counter 214. The first and second flip-flops FF1 and FF2, the first logic gate L1, and the first counter 214 function in a similar manner as described in FIG. 2.

The third logic gate L3 is coupled with the first logic gate L1, and configured to receive the logic output signal LS and generate and provide the valid signal VS to the security controller 106. The valid signal VS indicates that the count value CV provided to the security controller 106 is valid. When the logic output signal LS is at logic high state, the first counter 214 counts the number of cycles of the input clock signal ICS and the valid signal VS is generated at logic low state to indicate that the count value CV is invalid. When the logic output signal LS transitions from logic high state to logic low state, the first counter 214 completes the counting of the number of cycles of the input clock signal ICS and generates the count value CV. Thus, the valid signal VS transitions from logic low state to logic high state to further indicate that the count value CV is valid. In an embodiment, the third logic gate L3 is a NOT gate.

The diagnostic register 604 is coupled with the glitch detector 208 and the security controller 106, and configured to receive the alert signal AS and the acknowledgement signal ACK, and store information associated with the alert signal AS and the acknowledgement signal ACK. In one example, the information associated with the alert signal AS and the acknowledgement signal ACK may be utilized to diagnose an operation of the second clock glitch alerting circuit 504. In another example, the information associated with the alert signal AS and the acknowledgement signal ACK may be utilized to determine the delay duration indicated by the configuration data CD.

Figure 7:
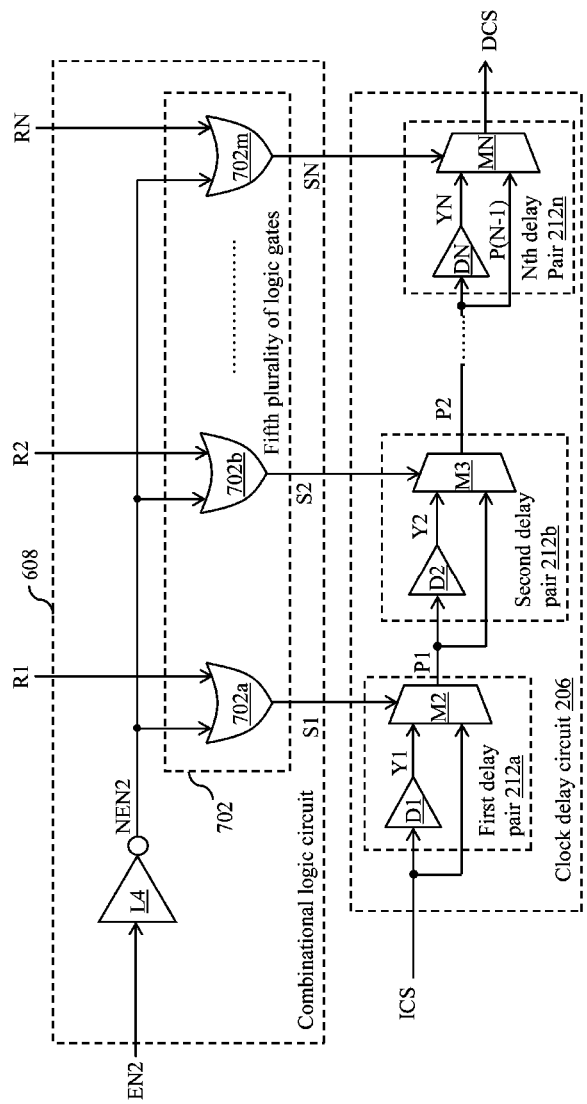
FIG. 7 is a schematic block diagram of a combinational logic circuit and a clock delay circuit of the second clock glitch alerting circuit of FIG. 6 in accordance with another embodiment of the present disclosure.

FIG. 7 is a schematic block diagram of the combinational logic circuit 608 and the clock delay circuit 206 in accordance with another embodiment of the present disclosure. The combinational logic circuit 608 includes a fourth logic gate L4 and a plurality of logic gates 702. The combinational logic circuit 608 is coupled with the second configuration register 602, the decoder 204, and the clock delay and gating circuit 610, and configured to receive the plurality of decoded configuration signals R1, R2, ..., RN, and the second enable signal EN2, and generate the plurality of selection signals S1, S2, ..., SN. The plurality of logic gates 702 includes fifth, sixth, and Mth logic gates 702a, 702b, and 702m. The fourth logic gate L4 is coupled with the second configuration register 602, and configured to receive the second enable signal EN2. The fourth logic gate L4 outputs an inverted version of the second enable signal EN2, hereinafter referred to as an "inverted second enable signal NEN2". The fifth, sixth, and Mth logic gates 702a, 702b, and 702m are coupled with the fourth logic gate L4, and configured to receive the inverted second enable signal NEN2. The fifth, sixth, and Mth logic gates 702a, 702b, and 702m are further coupled with the decoder 204, and further configured to receive the plurality of decoded configuration signals R1, R2, ..., RN and generate the plurality of selection signals S1, S2, ..., SN such that the fifth, sixth, and Mth logic gates 702a, 702b, and 702m receive first, second, and Nth decoded configuration signals R1, R2, and RN of the plurality of decoded configuration signals R1, R2, ..., RN, and generate the first, second, and Nth selection signals S1, S2, and SN, respectively.

The clock delay circuit 206 is coupled with the combinational logic circuit 608, and configured to receive the plurality of selection signals S1, S2, ..., SN. The plurality of delay pairs 212a, 212b, ..., 212n are configured to output the delayed clock output signal DCS. Each delay pair of the plurality of delay pairs 212a, 212b, ..., 212n includes a delay element and a multiplexer. The multiplexer of a corresponding delay pair of the plurality of delay pairs 212a, 212b, ..., 212n is coupled with the delay element of the corresponding delay pair and a corresponding logic gate of the combinational logic circuit 608. Thus, the second multiplexer M2, the third multiplexer M3, and the Nth multiplexer MN are coupled with the fifth logic gate 702a, the sixth logic gate 702b, and the Mth logic gate 702m, respectively. The second multiplexer M2, the third multiplexer M3, and the Nth multiplexer MN are configured to receive the first selection signal S1, the second selection signal S2, and the Nth selection signal SN, respectively. The clock delay circuit 206 functions in a manner similar as described in FIG. 2.

Figure 8:
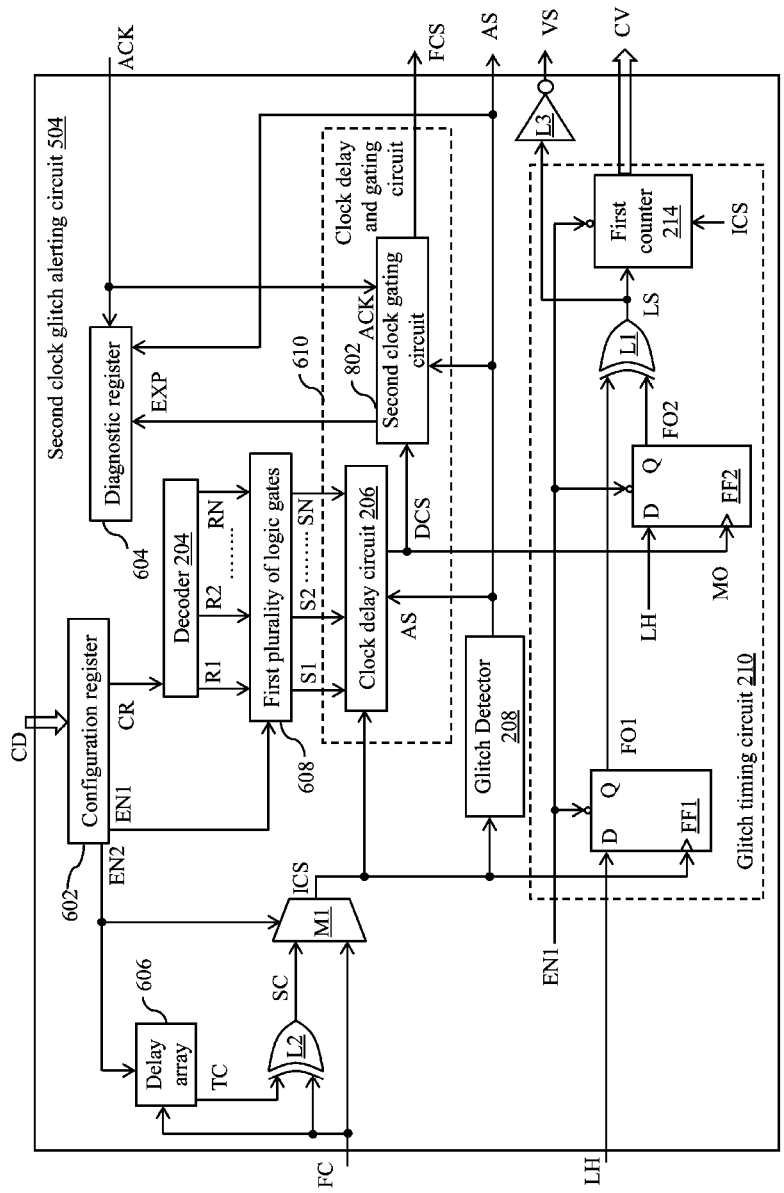
FIG. 8 is a schematic block diagram of the second clock glitch alerting circuit of the SoC of FIG. 5 in accordance with yet another embodiment of the present disclosure.

FIG. 8 is a schematic block diagram of the second clock glitch alerting circuit 504 of the SoC 100 of FIG. 5 in accordance with yet another embodiment of the present disclosure. The second clock glitch alerting circuit 504 of FIG. 8 includes the second configuration register 602, the diagnostic register 604, the delay array 606, the second and third logic gates L2 and L3, the decoder 204, the combinational logic circuit 608, the first multiplexer M1, the glitch detector 208, the glitch timing circuit 210, and the clock delay and gating circuit 610. The clock delay and gating circuit 610 includes the clock delay circuit 206 and a second clock gating circuit 802. The second configuration register 602, the delay array 606, the second and third logic gates L2 and L3, the decoder 204, the combinational logic circuit 608, the first multiplexer M1, the glitch detector 208, the glitch timing circuit 210, and the clock delay circuit 206 have been described in detail in FIGS. 2 and 6.

The diagnostic register 604 is coupled with the glitch detector 208 and a second counter 904 (shown later in FIG. 9) of the second clock gating circuit 802, and configured to receive the alert signal AS, the acknowledgement signal ACK, and an expiry signal EXP, and store information associated with the alert signal AS, the acknowledgement signal ACK, and the expiry signal EXP.

Figure 9:
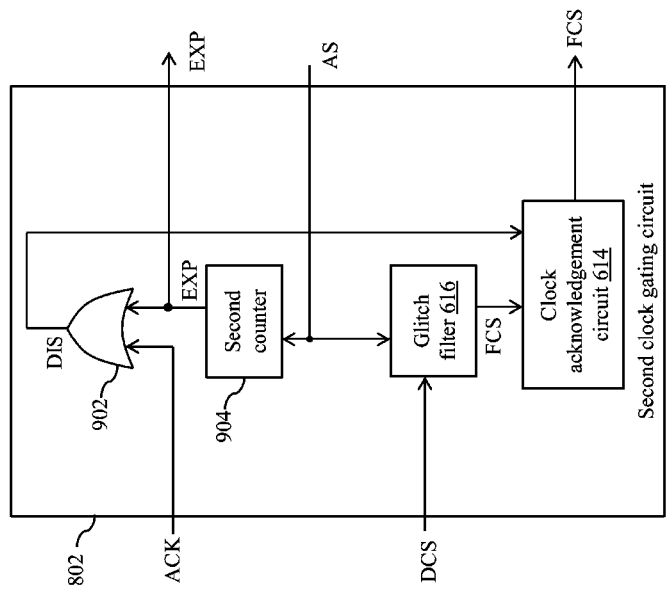
FIG. 9 is a schematic block diagram of a clock gating circuit of the second clock glitch alerting circuit of FIG. 8 in accordance with yet another embodiment of the present disclosure.

FIG. 9 is a schematic block diagram of the second clock gating circuit 802 in accordance with yet another embodiment of the present disclosure. The second clock gating circuit 802 includes the glitch filter 616, a seventh logic gate 902, the second counter 904, and the clock acknowledgement circuit 614.

The glitch filter 616 is coupled with the glitch detector 208 and the clock delay circuit 206, and configured to receive the alert signal AS and the delayed clock output signal DCS, filter the glitch in the delayed clock output signal DCS and generate the filtered clock output signal FCS. The glitch filter 616 functions in a manner similar as described in FIG. 6.

The second counter 904 is coupled with the glitch detector 208, and configured to receive the alert signal AS, and generate the expiry signal EXP. The second counter 904 activates the expiry signal EXP after a predetermined time duration that is initiated based on the reception of the activated alert signal AS. In one example, the second counter 904 initiates counting to generate a first count when the second counter 904 receives the activated alert signal AS. When the first count exceeds the predetermined time duration, the second counter 904 activates the expiry signal EXP. The seventh logic gate 902 is coupled with the second counter 904, and configured to receive the expiry signal EXP and the acknowledgement signal ACK, and generate a disable signal DIS. The acknowledgement signal ACK indicates an execution of the security critical operation by the security controller 106 based on the alert signal AS. The acknowledgement signal ACK remains deactivated until the security controller 106 executes the security critical operation. The disable signal DIS is activated when one of the expiry signal EXP is activated and the acknowledgement signal ACK is deactivated. In one example, the seventh logic gate 902 is an OR gate.

The clock acknowledgement circuit 614 is coupled with the glitch filter 616 and the seventh logic gate 902, and configured to receive the filtered clock output signal FCS and the disable signal DIS, and output and provide the filtered clock output signal FCS to the security controller 106. The filtered clock output signal FCS is provided when the disable signal DIS is deactivated, and the filtered clock output signal FCS is gated when the disable signal DIS is deactivated.

Figure 10:
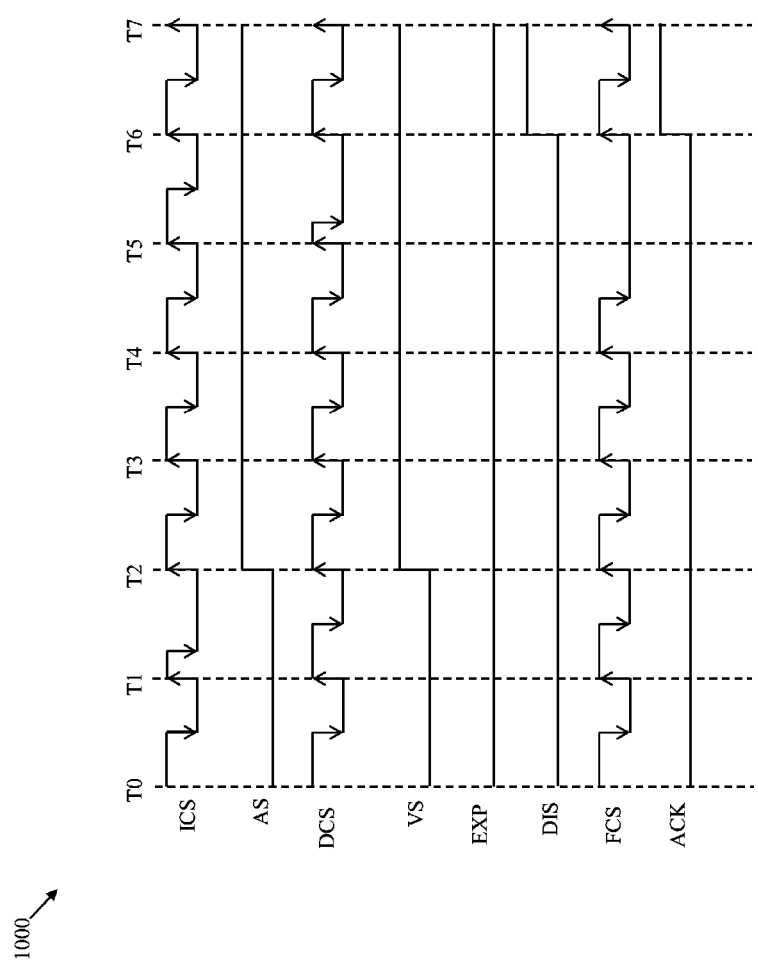
FIG. 10 is a timing diagram that illustrates an operation of the second clock glitch alerting circuit of FIG. 8 in accordance with another embodiment of the present disclosure.

FIG. 10 is a timing diagram 1000 that illustrates an operation of the second clock glitch alerting circuit 504 of FIG. 8 in accordance with another embodiment of the present disclosure.

During time period T0-T1, the input clock signal ICS completes one cycle, the delayed clock output signal DCS completes one cycle, the filtered clock output signal FCS completes one cycle, and the alert signal AS, the valid signal VS, the expiry signal EXP, the disable signal DIS, and the acknowledgement signal ACK are at logic low state.

During time period T1-T2, the glitch is introduced in the input clock signal ICS. In one embodiment, the frequency of the input clock signal ICS changes abruptly due to the introduced glitch. In one example, the frequency of the input clock signal ICS changes from one GHz to five GHz. As the delayed clock output signal DCS is a delayed version of the input clock signal ICS, the delayed clock output signal DCS completes one cycle, the filtered clock output signal FCS completes one cycle, and the alert signal AS, the valid signal VS, the expiry signal EXP, the disable signal DIS, and the acknowledgement signal ACK remain at logic low state. The glitch detector 208 receives the input clock signal ICS with the glitch, detects the glitch in the input clock signal ICS, and activates the alert signal AS. Simultaneously, the first logic gate L1 generates the logic output signal LS at logic low state and the third logic gate L3 generates the valid signal VS at logic high state. Thus, at time instance T2, the alert signal AS and the valid signal VS transition from logic low state to logic high state.

During time period T2-T3, the input clock signal ICS completes one cycle, the delayed clock output signal DCS completes one cycle, and the filtered clock output signal FCS completes one cycle. Further, the alert signal AS and the valid signal VS remain at logic high state, and the expiry signal EXP, the disable signal DIS, and the acknowledgement signal ACK remain at logic low state. The security controller 106 receives the activated alert signal AS, the activated valid signal VS, and the count value CV that indicates to the security controller 106 to generate a reaction within '3' clock cycles. Thus, the second clock glitch alerting circuit 504 provides an early indication to the security controller 106 of the glitch. Further, the second counter 904 receives the activated alert signal AS and starts counting based on the number of cycles of the input clock signal ICS. The glitch filter 616 receives the activated alert signal AS and initiates filtering of the delayed clock output signal DCS to filter the glitch and generate the filtered clock output signal FCS.

During time period T3-T5, the input clock signal ICS completes two cycles, the delayed clock output signal DCS completes two cycles, and the filtered clock output signal FCS completes two cycles. Further, the alert signal AS and the valid signal VS remain at logic high state, and the expiry signal EXP, the disable signal DIS, and the acknowledgement signal ACK remain at logic low state. Based on the indication received by way of the alert signal AS, the security controller 106 determines the reaction and initiates the execution of the security critical operation.

During time period T5-T6, the input clock signal ICS completes one cycle, the alert signal AS and the valid signal VS remain at logic high state, and the expiry signal EXP, the disable signal DIS, and the acknowledgement signal ACK remain at logic low state. The glitch filter 616 receives the delayed clock output signal DCS with the glitch, filters the glitch in the delayed clock output signal DCS, and provides the filtered clock output signal FCS to the clock acknowledgement circuit 614. The clock acknowledgement circuit 614 provides the filtered clock output signal FCS to the security controller 106. The security controller 106 completes the execution of the security critical operation and activates the acknowledgement signal ACK. Thus, at time instance T6, the acknowledgement signal ACK transitions from logic low state to logic high state. The seventh logic gate 902 receives the acknowledgement signal ACK at logic high state and activates the disable signal DIS. Thus, the disable signal DIS transitions from logic low state to logic high state.

During time period T6-T7, the input clock signal ICS completes one cycle, the delayed clock output signal DCS completes one cycle, and the filtered clock output signal FCS completes one cycle. Further, the alert signal AS, the valid signal VS, the acknowledgement signal ACK, and the disable signal DIS remain at logic high state, and the expiry signal EXP remains at logic low state. The clock acknowledgement circuit 614 gates the filtered clock output signal FCS (i.e., the security controller 106 does not receive the filtered clock output signal FCS). The security controller 106 completes the execution of the security critical operation as the security controller 106 receives the early indication from the second clock glitch alerting circuit 504.

Figure 11:
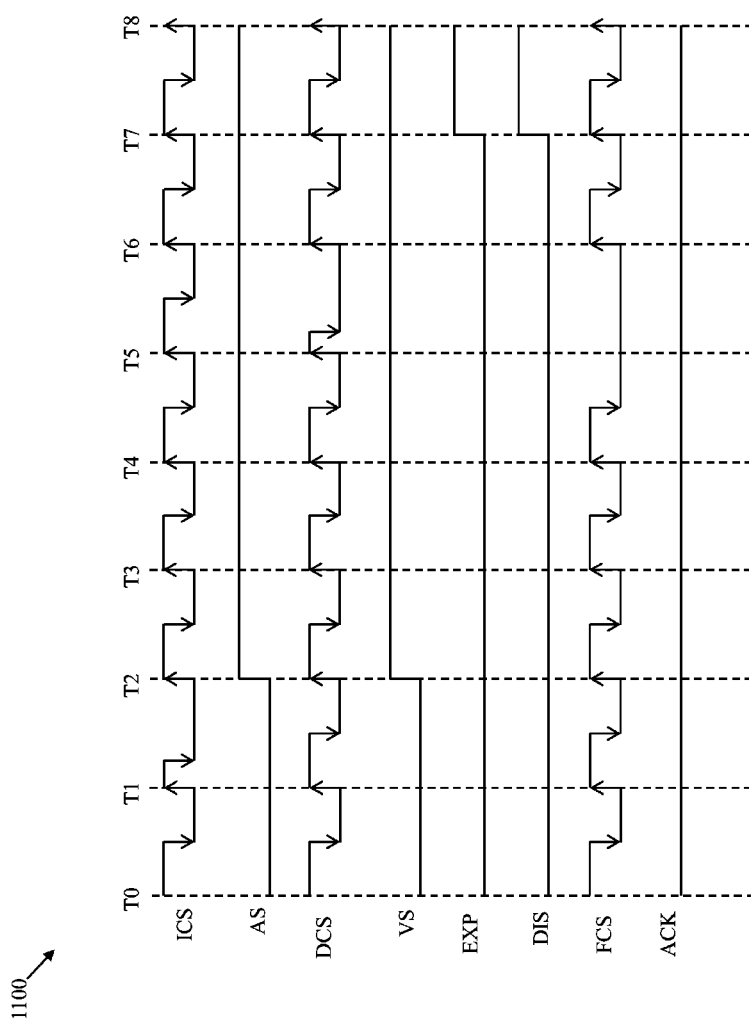
FIG. 11 is a timing diagram that illustrates an operation of the second clock glitch alerting circuit of FIG. 8 in accordance with another embodiment of the present disclosure.

FIG. 11 is a timing diagram 1100 that illustrates an operation of the second clock glitch alerting circuit 504 of FIG. 8 in accordance with another embodiment of the present disclosure.

During time period T0-T5, the input clock signal ICS, the delayed clock output signal DCS, the alert signal AS, the valid signal VS, the expiry signal EXP, the acknowledgement signal ACK, and the filtered clock output signal FCS function in the same manner as described in FIG. 10.

During time period T5-T6, the input clock signal ICS completes one cycle, the alert signal AS and the valid signal VS remain at logic high state, and the expiry signal EXP, the disable signal DIS, and the acknowledgement signal ACK remain at logic low state. The glitch filter 616 receives the delayed clock output signal DCS with the glitch, filters the glitch in the delayed clock output signal DCS, and provides the filtered clock output signal FCS to the clock acknowledgement circuit 614. The clock acknowledgement circuit 614 provides the filtered clock output signal FCS to the security controller 106. However, in a scenario, the security controller 106 is unable to execute the security critical operation and the acknowledgement signal ACK thus remains deactivated.

During time period T6-T7, the input clock signal ICS completes one cycle, the delayed clock output signal DCS completes one cycle, and the filtered clock output signal FCS completes one cycle. Further, the alert signal AS and the valid signal VS remain at logic high state, and the acknowledgement signal ACK, the disable signal DIS, and the expiry signal EXP remain at logic low state. The second counter 904 thus exceeds the predetermined time duration and activates the expiry signal EXP. The clock acknowledgement circuit 614 receives the activated expiry signal EXP and activates the disable signal DIS. Thus, at time instance T7, the expiry signal EXP and the disable signal DIS transition from logic low state to logic high state.

During time period T7-T8, the input clock signal ICS completes one cycle, the delayed clock output signal DCS completes one cycle, and the filtered clock output signal FCS completes one cycle. Further, the alert signal AS, the valid signal VS, the disable signal DIS, and the expiry signal EXP remain at logic high state, and the acknowledgement signal ACK remains at logic low state. The clock acknowledgement circuit 614 gates the filtered clock output signal FCS (i.e., the security controller 106 does not receive the filtered clock output signal FCS). Thus, the filtered clock output signal FCS is gated to prevent the security controller 106 from getting damaged as the security controller 106 is unable to complete the execution of the security critical operation in the predetermined time duration.

As the security controller 106 receives the count value CV and the alert signal AS, the security controller 106 is capable of utilizing the delay duration after the reception of the activated alert signal AS to execute the security critical operation before the glitch in the delayed clock output signal DCS reaches the security controller 106 or the delay duration expires. Thus, corruption of secure information of the SoC 100 as well as damage to components of the SoC 100 is prevented. Further, in one embodiment, if the security controller 106 is unable to execute the security critical operation within the delay duration indicated by the count value CV, the second clock glitch alerting circuit 504 gates the filtered clock output signal FCS (i.e., does not provide the filtered clock output signal FCS to the security controller 106). Thus, any damage to the components of the SoC 100 due to the glitch is prevented.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims.

The invention claimed is:

1. A clock glitch alerting circuit, comprising:
   a glitch detector that is configured to receive an input clock signal, and generate and provide an alert signal to a security controller that is coupled with the clock glitch alerting circuit, wherein the alert signal is activated when the input clock signal has a glitch;
   a clock delay circuit that is configured to receive a plurality of selection signals and the input clock signal, delay the input clock signal based on a set of delay values to output and provide a delayed clock output signal to the security controller, wherein the set of delay values are based on the plurality of selection signals, and wherein after the activated alert signal is provided, the delayed clock output signal with the glitch is provided to the security controller; and
   a glitch timing circuit that is coupled with the clock delay circuit, and configured to receive the input clock signal, the delayed clock output signal, a logic high signal, and an enable signal, and generate and provide a count value to the security controller, wherein the count value indicates a delay duration between providing the activated alert signal and the delayed clock output signal with the glitch to the security controller.

2. The clock glitch alerting circuit of claim 1, further comprising:
   a decoder that is coupled with the clock delay circuit, and configured to receive one of a configuration signal and a fixed bit signal, and generate and provide the plurality of selection signals to the clock delay circuit based on one of the configuration signal and a fixed bit signal, wherein the plurality of selection signals are based on a delay duration that is indicated by the configuration signal.

3. The clock glitch alerting circuit of claim 2, further comprising:
   a configuration register that is coupled with the decoder and the glitch timing circuit, and configured to receive configuration data, generate the configuration signal and the enable signal, and provide the configuration signal to the decoder and the enable signal to the glitch timing circuit, wherein when the enable signal is activated, the clock delay circuit receives the input clock signal, and wherein the configuration data is provided by the security controller.

4. The clock glitch alerting circuit of claim 1, wherein the clock delay circuit comprises:
   a plurality of delay pairs that are configured to output the delayed clock output signal, wherein each delay pair of the plurality of delay pairs includes a delay element and a multiplexer, and wherein the multiplexer of a corresponding delay pair of the plurality of delay pairs is coupled with the delay element of the corresponding delay pair.

5. The clock glitch alerting circuit of claim 4, wherein the delay element of each delay pair of the plurality of delay pairs is configured to receive a first input signal and generate a corresponding delayed first input signal of a plurality of delayed first input signals, and the multiplexer of each delay pair of the plurality of delay pairs is configured to receive a corresponding selection signal of the plurality of selection signals, the corresponding delayed first input signal, and the first input signal, wherein the multiplexer of each delay pair of the plurality of delay pairs, is further configured to select and output, based on the corresponding selection signal, one of the corresponding delayed first input signal and the first input signal, and wherein the first input signal is one of the input clock signal and a corresponding output of a previous multiplexer of a previous delay pair of the plurality of delay pairs.

6. The clock glitch alerting circuit of claim 1, wherein the glitch timing circuit comprises:
   a first flip-flop that is configured to receive the logic high signal at an input terminal, the enable signal at an inverted reset terminal, and the input clock signal at a clock terminal, and generate a first flop-output signal at an output terminal thereof;
   a second flip-flop that is coupled with the clock delay circuit, and configured to receive the logic high signal at an input terminal, the enable signal at an inverted reset terminal, and the delayed clock output signal at a clock terminal, and generate a second flop-output signal at an output terminal thereof;
   a logic gate that is coupled with the output terminals of the first and second flip-flops, and configured to receive the first and second flop-output signals and generate a logic output signal; and
   a counter that is coupled with the logic gate, and configured to receive the logic output signal, the enable signal, and the input clock signal, and generate and provide the count value to the security controller.

7. The clock glitch alerting circuit of claim 6, wherein when the logic output signal and the enable signal are at logic high states, the counter is configured to count a number of cycles of the input clock signal, and wherein the count value is generated based on the counted number of cycles.

8. A clock glitch alerting circuit, comprising:
   a glitch detector that is configured to receive an input clock signal, and generate and provide an alert signal to a security controller that is coupled with the clock glitch alerting circuit, wherein the alert signal is activated when the input clock signal has a glitch;
   a clock delay and gating circuit that is coupled with the glitch detector, and configured to receive a plurality of selection signals, the alert signal, an acknowledgement signal, and the input clock signal, delay the input clock signal based on a set of delay values to output a delayed clock output signal, and generate and provide, based on the alert signal, the delayed clock output signal, and the acknowledgement signal, a filtered clock output signal to the security controller, wherein the set of delay values are based on the plurality of selection signals, and wherein the filtered clock output signal is provided to the security controller based on the acknowledgement signal; and
   a glitch timing circuit that is coupled with the clock delay and gating circuit, and configured to receive the input clock signal, the delayed clock output signal, a logic high signal, and a first enable signal, and generate and provide a count value to the security controller, wherein the count value indicates a time duration available by the security controller to execute a security critical operation after receiving the activated alert signal, and wherein the security critical operation is executed based on the filtered clock output signal.

9. The clock glitch alerting circuit of claim 8, further comprising:
a configuration register that is configured to receive configuration data, and generate the first enable signal, a second enable signal, and a configuration signal;
a decoder that is coupled with the configuration register, and configured to receive the configuration signal, and generate a plurality of decoded configuration signals; and
a combinational logic circuit that is coupled with the configuration register, the decoder, and the clock delay and gating circuit, and configured to receive the plurality of decoded configuration signals and the first enable signal, and generate the plurality of selection signals.

10. The clock glitch alerting circuit of claim 9, further comprising:
a delay array that is coupled with the configuration register, and configured to receive the second enable signal and a first clock signal, and delay the first clock signal based on the second enable signal to generate a test clock signal; and
a first logic gate that is coupled with the delay array, and configured to receive the test clock signal and the first clock signal, and generate a second clock signal.

11. The clock glitch alerting circuit of claim 10, further comprising:
a first multiplexer that is coupled with the configuration register, the first logic gate, and the clock delay and gating circuit, and configured to receive the second enable signal, the second clock signal, and the first clock signal, and select and provide, based on the second enable signal, one of the second clock signal and the first clock signal as the input clock signal to the clock delay and gating circuit.

12. The clock glitch alerting circuit of claim 11, wherein the glitch timing circuit comprises:
a first flip-flop that is coupled with the configuration register and the first multiplexer, and configured to receive the logic high signal at an input terminal, the input clock signal at a clock terminal, and the first enable signal at an inverted reset terminal, and generate a first flop-output signal at an output terminal thereof;
a second flip-flop that is coupled with the clock delay and gating circuit and the configuration register, and configured to receive the logic high signal at an input terminal, the delayed clock output signal at a clock terminal, and the first enable signal at an inverted reset terminal, and generate a second flop-output signal at an output terminal thereof;
a second logic gate that is coupled with the output terminals of the first and second flip-flops, and configured to receive the first and second flop-output signals and generate a logic output signal; and
a first counter that is coupled with the configuration register and the second logic gate, and configured to receive the logic output signal, the first enable signal, and the input clock signal, and generate and provide the count value to the security controller.

13. The clock glitch alerting circuit of claim 12, wherein when the logic output signal and the first enable signal are at logic high states, the first counter is configured to count a number of cycles of the input clock signal, and wherein the count value is generated based on the counted number of cycles.

14. The clock glitch alerting circuit of claim 12, further comprising:
a third logic gate that is coupled with the second logic gate, and configured to receive the logic output signal and generate and provide a valid signal to the security controller, wherein the valid signal indicates that the count value provided to the security controller is valid.

15. The clock glitch alerting circuit of claim 9, wherein the clock delay and gating circuit comprises:
a clock delay circuit that is configured to receive the plurality of selection signals and the input clock signal, and delay the input clock signal based on the set of delay values to output the delayed clock output signal; and
a clock gating circuit that is coupled with the clock delay circuit and the glitch detector, and configured to receive the delayed clock output signal, the alert signal, and the acknowledgement signal, and generate and provide the filtered clock output signal to the security controller.

16. The clock glitch alerting circuit of claim 15, wherein the clock delay circuit comprises:
a plurality of delay pairs that are configured to output the delayed clock output signal, wherein:
each delay pair of the plurality of delay pairs includes a delay element and a multiplexer,
the multiplexer of a corresponding delay pair of the plurality of delay pairs is coupled with the delay element of the corresponding delay pair and the combinational logic circuit,
the delay element of each delay pair of the plurality of delay pairs is configured to receive a first input signal and generate a corresponding delayed first input signal of a plurality of delayed first input signals, and the multiplexer of each delay pair of the plurality of delay pairs is configured to receive a corresponding selection signal of the plurality of selection signals, the corresponding delayed first input signal, and the first input signal,
the multiplexer of each delay pair of the plurality of delay pairs is further configured to select and output based on the corresponding selection signal, one of the corresponding delayed first input signal and the first input signal, and
the first input signal is one of the input clock signal and a corresponding output of a previous multiplexer of a previous delay pair of the plurality of delay pairs.

17. The clock glitch alerting circuit of claim 15, wherein the clock gating circuit comprises:
a glitch filter that is coupled with the glitch detector and the clock delay circuit, and configured to receive the alert signal and the delayed clock output signal, and generate the filtered clock output signal; and
a clock acknowledgement circuit that is coupled with the glitch filter, and configured to receive the filtered clock output signal and the acknowledgement signal, and output and provide the filtered clock output signal to the security controller based on the acknowledgement signal.

18. The clock glitch alerting circuit of claim 15, wherein the clock gating circuit comprises:
a glitch filter that is coupled with the glitch detector and the clock delay circuit, and configured to receive the alert signal and the delayed clock output signal, and generate the filtered clock output signal;

a second counter that is coupled with the glitch detector, and configured to receive the alert signal, and generate an expiry signal, wherein the second counter activates the expiry signal after a predetermined time duration that is initiated based on the reception of the activated alert signal;

a fourth logic gate that is coupled with the second counter, and configured to receive the expiry signal and the acknowledgement signal, and generate a disable signal, wherein the acknowledgement signal indicates an execution of a security operation by the security controller based on the alert signal, and wherein the disable signal is activated when one of the expiry signal is activated and the acknowledgement signal is activated;

a clock acknowledgement circuit that is coupled with the glitch filter and the combinational logic circuit, and configured to receive the filtered output signal and the disable signal, and output and provide the filtered clock output signal to the security controller, wherein the filtered clock output signal is provided when the disable signal is activated, and the filtered clock output signal is gated when the disable signal is deactivated; and a diagnostic register that is coupled with the glitch detector and the second counter, and configured to receive the alert signal, the acknowledgement signal, and the expiry signal, and store information associated with the alert signal, the acknowledgement signal, and the expiry signal.

19. A clock glitch alerting circuit, comprising:

a glitch detector that is configured to receive an input clock signal, and generate and provide an alert signal to a security controller that is coupled with the clock glitch alerting circuit, wherein the alert signal is activated when the input clock signal has a glitch;

delay circuitry that is configured to receive a plurality of selection signals and the input clock signal, delay the input clock signal based on the plurality of selection signals to generate a delayed clock output signal, and output and provide one of the delayed clock output signal and a filtered clock output signal to the security controller, wherein the delayed clock output signal with the glitch is provided after the activated alert signal is provided to the security controller, and wherein the filtered clock output signal is outputted based on the delayed clock output signal; and a glitch timing circuit that is coupled with the delay circuitry, and configured to receive the input clock signal, the delayed clock output signal, a logic high signal, and a first enable signal, and generate and provide a count value to the security controller, wherein the count value indicates a time duration available by the security controller to execute a security critical operation after receiving the activated alert signal, and wherein the security critical operation is executed based on one of the delayed clock output signal and the filtered clock output signal.

20. The clock glitch alerting circuit of claim 19, wherein the delay circuitry is coupled with the glitch detector, and further configured to receive the alert signal and an acknowledgement signal, wherein the acknowledgement signal is provided by the security controller to the delay circuitry, and wherein the delay circuitry provides the filtered clock output signal to the security controller further based on the alert signal and the acknowledgement signal.

* * * * *